(12) United States Patent
Kim

(10) Patent No.: US 7,473,631 B2
(45) Date of Patent: Jan. 6, 2009

(54) METHOD OF FORMING CONTACT HOLES IN A SEMICONDUCTOR DEVICE HAVING FIRST AND SECOND METAL LAYERS

(75) Inventor: Young-Pil Kim, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 19 days.

(21) Appl. No.: 11/289,938

(22) Filed: Nov. 29, 2005

(65) Prior Publication Data

US 2006/0128140 A1 Jun. 15, 2006

(30) Foreign Application Priority Data

Dec. 15, 2004 (KR) .................. 10-2004-0106157

(51) Int. Cl.
*H01L 21/4763* (2006.01)
(52) U.S. Cl. .............................. 438/620; 257/E21.507; 257/E21.627; 438/637

(58) Field of Classification Search .................. 438/620, 438/737, 637; 257/E21.507, E21.627
See application file for complete search history.

(56) References Cited

U.S. PATENT DOCUMENTS

| 4,109,275 | A | * | 8/1978 | Sarkary ....................... 257/774 |
| 6,589,864 | B2 | * | 7/2003 | Yiu et al. ..................... 438/637 |
| 2006/0148251 | A1 | * | 7/2006 | Broekaart et al. ........... 438/669 |

* cited by examiner

*Primary Examiner*—Asok K Sarkar
(74) *Attorney, Agent, or Firm*—Andrew D. Fortney

(57) ABSTRACT

An exemplary method of forming a contact hole in a semiconductor device includes: forming a first insulation layer on a lower substrate; forming a first conductive layer on the first insulation layer; forming a second insulation layer on the first insulation layer and the first conductive layer; forming a second conductive layer on the second insulation layer; forming a third insulation layer on the second insulation layer and the second conductive layer; patterning a resist on the third insulation layer using an exposure mask of which transmittance is different at a region over the first conductive layer and at a region over the second conductive layer; and forming a first contact hole and a second contact hole by etching the resist and the third insulation layer such that the first conductive layer and the second conductive layer are exposed.

18 Claims, 4 Drawing Sheets

METHOD OF FORMING CONTACT HOLES IN A SEMICONDUCTOR DEVICE HAVING FIRST AND SECOND METAL LAYERS

CROSS-REFERENCE TO RELATED APPLICATION

This application claims priority to and the benefit of Korean Patent Application No. 10-2004-0106157, filed in the Korean Intellectual Property Office on Dec. 15, 2005, the entire contents of which are incorporated herein by reference.

BACKGROUND OF THE INVENTION (a) Field of the Invention

The present invention relates to a method of manufacturing a semiconductor device. More particularly, the present invention relates to a method of forming a contact hole for electrically connecting an upper conductive layer to a lower conductive layer, where they are electrically insulated by an insulating layer.

(b) Description of the Related Art

As semiconductor integrated circuits have become more highly integrated, a width or a space of an interconnection line has become smaller, and a size of a contact hole or via hole to connect between metal interconnection line layers, or a size of a contact hole to connect a gate or a source/drain to a metal line layer, has also been decreased. Accordingly, much research has been conducted in order to decrease the contact resistance of such a contact hole and to improve a process window.

More particularly, multi-layer wiring technology is a technology to make interconnection lines in the integrated circuits multi-layered so as to highly integrate a semiconductor device in a limited area of a substrate. Therefore, such multi-layer wiring technology has a merit of decreasing the size of a semiconductor chip because there is no need to consider a space for interconnection lines to pass between semiconductor devices.

FIG. 1A to FIG. 1D are cross-sectional views showing sequential stages of a conventional method of forming a contact hole in a semiconductor device.

As shown in FIG. 1A, a first insulation layer 100 is formed on a substrate which includes a transistor (not shown) and multi-layer metal lines in its lower part. A first conductive layer 120 is formed on the first insulation layer 100. In addition, a second insulation layer 110 is formed on the first insulation layer 100 and the first conductive layer 120. Thereafter, a second conductive layer 130 is deposited on the second insulation layer 110, and is patterned by performing a photolithography and etching process.

Subsequently, as shown in FIG. 1B, a third insulation layer 140 is blanket deposited on the surface of the substrate, including the second conductive layer 130. A resist 150 is coated on the third insulation layer 140, and the resist 150 is patterned through a lithographic process by removing the resist 150 in a region where a contact hole (or via hole) will be formed.

As shown in FIG. 1C, a contact hole 141 and a contact hole 143 are formed by etching the third insulation layer 140 and the second insulation layer 110 using the patterned resist 150 as an etch layer. The contact hole 141 is a hole in which a contact to the second conductive layer 130 on the second insulation layer 110 is to be formed, and the contact hole 143 is a hole in which a contact to the first conductive layer 120 on the first insulation layer 100 is to be formed. Therefore, the etching depth of the contact hole 141 is different from that of the contact hole 143. Consequently, as shown in FIG. 1C, when the contact hole 141 and the contact hole 143 are simultaneously formed in the same etching process, etching for the region of the contact hole 143 may be performed correctly to a surface of the first conductive layer 120, but etching for the region of the contact hole 141 may be performed excessively such that the second conductive layer 130 may be damaged by overetching into an upper part of the second conductive layer 130.

On the other hand, as shown in FIG. 1D, etching for the region of the contact hole 141 may be performed correctly to a surface of the second conductive layer 130, but etching for the region of the contact hole 143 may be performed insufficiently such that the first conductive layer 120 may not be exposed. Therefore, when contact holes or via holes having different etching depths should be formed simultaneously, a deterioration of contact resistance or excessive damage to a conductive layer may occur because a process window is very insufficient in the case of a small-sized contact hole.

The above information disclosed in this Background section is only for enhancement of understanding of the background of the invention. Therefore, it may contain information that does not form prior art or other information that is already known in this or any other country to a person of ordinary skill in the art.

SUMMARY OF THE INVENTION

The present invention has been made in an effort to provide a method of forming a contact hole in a semiconductor device having advantages of ensuring a low contact resistance and a process window in simultaneously forming contact holes (via holes) on conductive layers having different vertical locations.

According to an exemplary embodiment of the present invention, a method of forming a contact hole in a semiconductor device includes: forming a first insulation layer on an underlying substrate; forming a first conductive layer on the first insulation layer; forming a second insulation layer on the first insulation layer and the first conductive layer; forming a second conductive layer on the second insulation layer; forming a third insulation layer on the second insulation layer and the second conductive layer; forming a resist on the third insulation layer; patterning the resist using an exposure mask of which transmittance is different at a region over the first conductive layer and at a region over the second conductive layer; and forming a first contact hole and a second contact hole by etching the resist and the third insulation layer using the resist pattern as an etch mask such that the first conductive layer and the second conductive layer are exposed.

The first conductive layer and the second conductive layer may not completely overlap each other, and the transmittance of the exposure mask is lower at the region over the second conductive layer than at the region over the first conductive layer. Furthermore, forming the first and second contact holes may comprise etching the resist and the third insulation layer using etch selectivity.

According to another exemplary embodiment of the present convention, a method of forming a contact hole in a semiconductor device having first and second contact holes of different etching depths includes coating a resist on the semiconductor device, forming a resist pattern by performing a lithographic process on the resist using an exposure mask of which a transmittance is different at a region for the first hole and at a region for the second hole, and forming the first and second contact holes by etching an insulator layer using the resist pattern as an etch mask.

An etching depth of the first contact hole may be greater than that of the second contact hole, and the exposure mask may have transmittance that is higher at the region for the first contact hole than at the region for the second contact hole.

After forming the resist pattern, some resist may be left in the region for the second contact hole, and forming the first and second contact holes may comprise etching the resist left in the region for the second contact hole and the insulator layer using etch selectivity.

DETAILED DESCRIPTION OF THE EMBODIMENTS

Figure 1A:
FIG. 1A to FIG. 1D are cross-sectional views showing sequential stages of a conventional method of forming a contact hole in a semiconductor device.
Figure 1B:
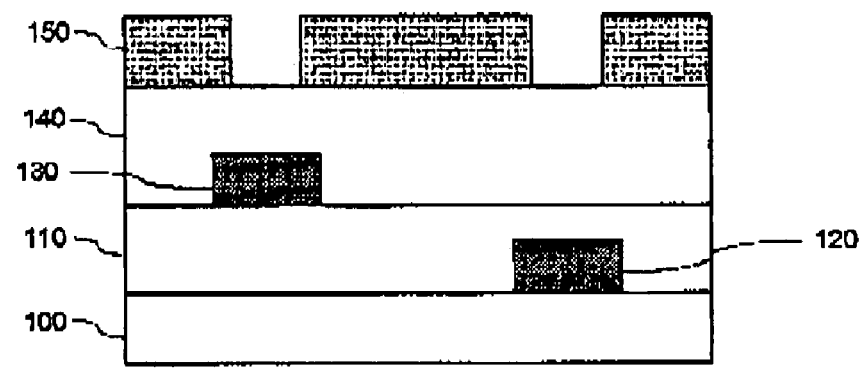
Figure 1C:
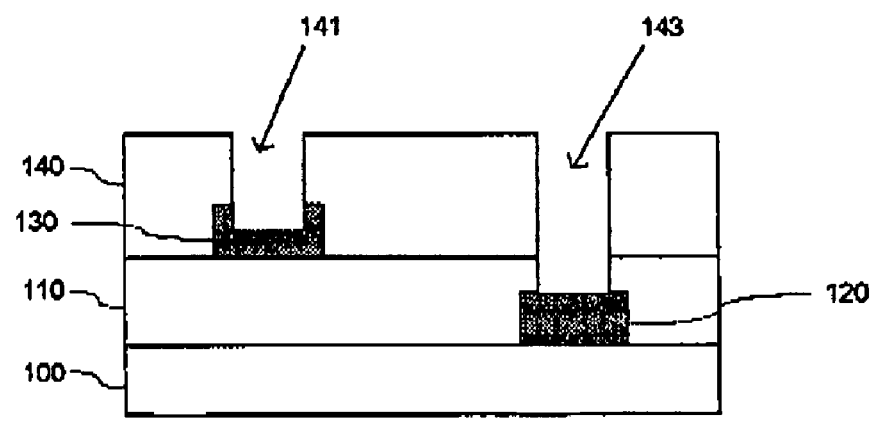
Figure 1D:
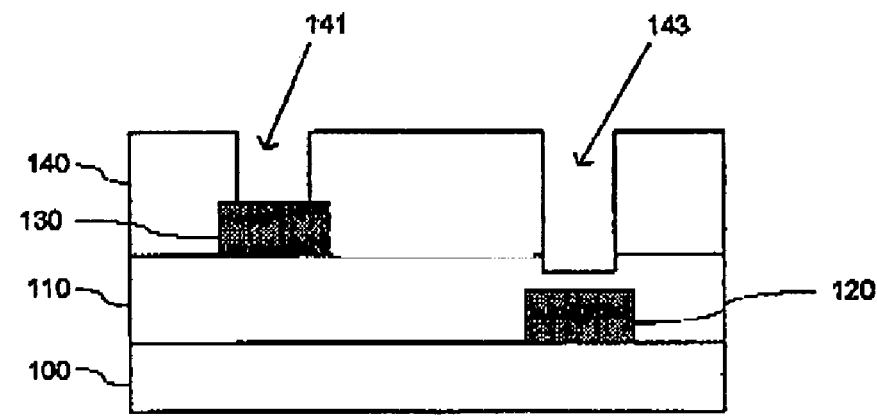

With reference to the accompanying drawings, an embodiment of the present invention will be described in order for those skilled in the art to be able to implement the invention. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

First, a method of forming a contact hole in a semiconductor device according to an exemplary embodiment of the present invention will hereinafter be described in detail with reference to FIG. 2A to 2D, which are cross-sectional views showing sequential stages of the exemplary embodiment.

Figure 2A:
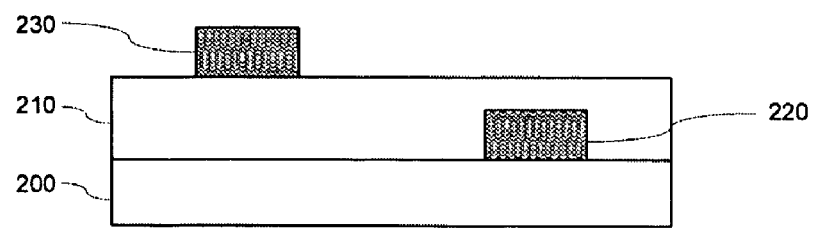
FIG. 2A to FIG. 2D are cross-sectional views showing sequential stages of a method of forming a contact hole in a semiconductor device according to an exemplary embodiment of the present invention.

As shown in FIG. 2A, a first insulation layer 200 is formed on a substrate which includes a transistor and multi-layer metal lines in its lower part. A first conductive layer 220 is formed on the first insulation layer 200. In addition, a second insulation layer 210 is formed on the first insulation layer 200 and the first conductive layer 220. In one alternative, a contact may be formed in the second insulation layer 210 from its upper surface to the first conductive layer 220. Thus, the first conductive layer 220 may comprise a metal wire-metal plug stack, substantially completely penetrating the second insulation layer 210. In such an embodiment, the second insulation layer 210 may have an etch stop sublayer at its uppermost surface, in which the etch stop sublayer generally has a relatively low etch rate in comparison with the etch rate of an overlying insulation layer during the step of forming a contact hole through the overlying insulation layer. Thereafter, a second conductive layer 230 is deposited on the second insulation layer 210 and patterned by performing a photolithography and etching process. The first conductive layer 220 and the second conductive layer 230 generally do not completely overlap each other.

Figure 2B:
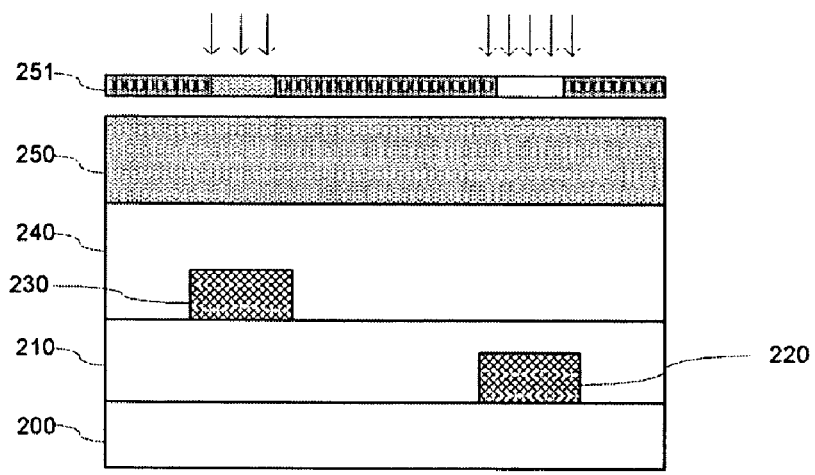

Subsequently, as shown in FIG. 2B, a third insulation layer 240 is formed on the entire surface of the substrate including the second conductive layer 230. A resist 250 is coated on the third insulation layer 240. In addition, the resist 250 is patterned through a lithographic process by substantially completely removing the resist 250 in a first region where a first contact hole (via hole) will expose the first conductive layer 220 and partially removing the resist 250 in a second region where a second contact hole (via hole) will expose the second conductive layer 230. Here, the contact holes, like the first conductive layer 220 and the second conductive layer 230, are formed without completely overlapping each other. In the lithographic process, exposure is performed by using a mask 251 of which transmittance is different at a contact hole 243 region to the first conductive layer 220 and at a contact hole 241 region to the second conductive layer 230. Particularly, the transmittance of the mask 251 is low at the contact hole 241 region formed to the second conductive layer 230, and high at the contact hole 243 region formed to the first conductive layer 220. Thus, the method may further comprise irradiating the resist 250 by transmitting photolithographic light through a mask 251 having a first, relatively high transmittance at a first contact hole region over the first conductive layer 220 and a second, relatively low transmittance at a contact hole region over the second conductive layer 230.

Figure 2C:
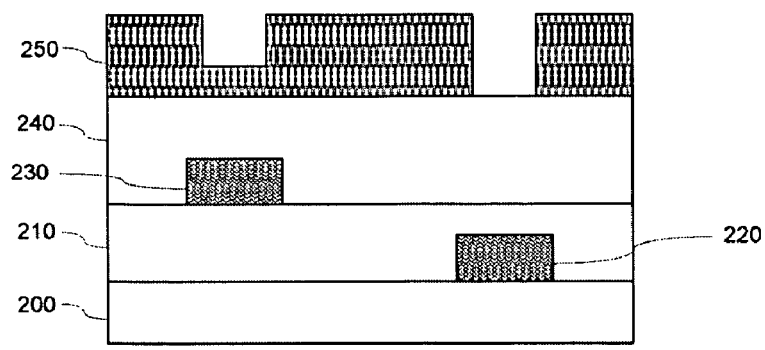

As shown in FIG. 2C, after a lithographic process is performed by using the mask 251 with different transmittance areas, the resist 250 comprises a pattern in which resist material is partially left on the region in which a contact hole will be formed to the second conductive layer 230, but it is completely removed from the region in which a contact hole will be formed to the first conductive layer 220.

Figure 2D:
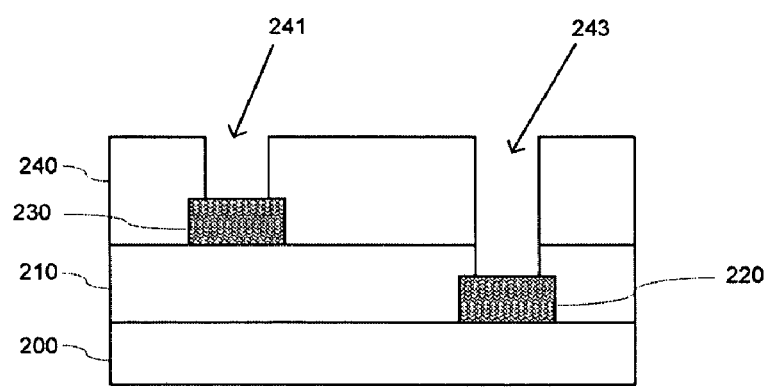

The resulting structure is shown in FIG. 2D, after respectively forming a contact hole 241 and a contact hole 243 by etching the third insulation layer 240 having the patterned resist 250 thereon. The contact holes are etched or formed using etch selectivity. Here, the same etching process respectively forms the contact hole 241 and the contact hole 243 without damaging the second conductive layer 230 or the first conductive layer 220 because the resist 250 is not left over the first conductive layer 220 but is partially left over the second conductive layer 230. It is within the abilities of those skilled in the art to select mask transmittance values and/or etch conditions that allow substantially similar etch times for simultaneously etching through (1) the remaining photoresist in the contact hole region over the second conductive layer 230 and (2) the excess thickness of the insulator in the contact hole region over the first conductive layer 220 (relative to the thickness of the third insulation layer 240 over the second conductive layer 230).

Consequently, according to an exemplary embodiment of the present invention, a resist left in a contact hole region having a small etching depth is etched at a relatively low rate (e.g., by etch selectivity), while a contact hole region having a large etching depth is etched at a relatively high rate, because a resist is not left on a contact hole region having a large etching depth but is left on a contact hole region having a small etching depth. Therefore, etching a contact hole in a region having a small etching depth may be completed without damaging a conductive layer, while at the same time enabling etching a contact hole in a region having a large etching depth to be completed.

According to the present invention, in the case of forming contact holes simultaneously on conductive layers having different vertical locations from each other, a resist is patterned by using a mask having different transmittances in the regions where the different contact holes to the different conductive layers will be formed. Therefore, a resist on a contact hole region having a large etching depth is removed completely, but a resist on a contact hole region having a small etching depth is partially left. Consequently, even if a contact hole region having a large etching depth and a contact hole region having a small etching depth are simultaneously etched, problems such as damage to a conductive layer caused by excessive etching, or insufficient etching to a conductive layer, may not occur because such a resist pattern is used as an etch mask. When a semiconductor device is formed as mentioned above, contact resistance required for normal operation may be obtained, and a design margin may be furnished to a process designer by improving a process window. Furthermore, the present method may avoid a need to use separate photolithography and etching steps to form the different contact holes having different depths.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of forming a contact hole in a semiconductor device, the method comprising:
    forming a first insulation layer on an underlying substrate;
    forming a first conductive layer on a part of the first insulation layer;
    forming a second insulation layer having a planar, horizontal upper surface on the first insulation layer and the first conductive layer, wherein the planar, horizontal upper surface of the second insulation layer is over both the first insulating layer and the first conductive layer;
    forming a second conductive layer on a part of the second insulation layer, wherein the second conductive layer does not completely overlap with the first conductive layer;
    forming a third insulation layer having a planar, horizontal upper surface on the second insulation layer and the second conductive layer, wherein the planar, horizontal upper surface of the third insulation layer is over both the second insulating layer and the second conductive layer;
    forming a resist having a planar, horizontal upper surface on the third insulation layer;
    patterning the resist using an exposure mask of which transmittance is different at a first region over the first conductive layer and at a second region over the second conductive layer; and
    forming a first contact hole and a second contact hole by etching the resist and the third insulation layer using the resist pattern as an etch mask such that the first conductive layer and the second conductive layer are exposed.

2. The method of claim 1, wherein the transmittance of the exposure mask is lower at the region over the second conductive layer than at the region over the first conductive layer.

3. The method of claim 1, wherein forming the first contact hole and the second contact hole comprises etching the resist pattern and the third insulation layer using etch selectivity.

4. The method of claim 1, wherein after patterning the resist, the first contact hole region has a relatively large amount of remaining resist and the first contact hole is formed at a relatively low rate, and the second contact hole region has a relatively small amount or no remaining resist and the second contact hole is formed at a relatively high rate.

5. The method of claim 1, wherein the first and second conductive layers have a same height and width.

6. The method of claim 1, wherein the second insulating layer has a greater thickness than that of the first insulating layer.

7. The method of claim 1, wherein the width of the light transmitting portions of the exposure mask are smaller than the width of the conductive layers.

8. The method of claim 1, wherein the planar, horizontal upper surface of the second insulating layer is continuously planar over both the first insulating layer and the first metal layer.

9. The method of claim 8, wherein the planar, horizontal upper surface of the third insulating layer is continuously planar over both the second insulating layer and the second metal layer.

10. A method of forming contact holes in a semiconductor device having first and second metal layers, the method comprising:
    coating a resist on the semiconductor device comprising the first metal layer, a first insulating layer thereon having a planar, horizontal upper surface, the second metal layer, and a second insulating layer on the first insulating layer and the second metal layer, the second metal layer being on a planar horizontal upper surface of the first insulating layer and not overlapping with the first metal layer, and the second insulating layer having a planar, horizontal upper surface over both the first insulating layer and the second metal layer;
    forming a resist pattern having a planar, horizontal upper surface by performing a lithographic process on the resist using an exposure mask having a first transmittance at a first region for a first contact hole to the first metal layer, and a second transmittance at a second region for a second contact hole to the second metal layer, the first transmittance differing from the second transmittance, and the first and second contact holes having different etching depths; and
    forming the first and second contact holes by etching the first and second insulating layers using the resist pattern as an etch mask.

11. The method of claim 10, wherein an etching depth of the first contact hole is greater than that of the second contact hole, and the exposure mask has higher transmittance at the first region than at the second region.

12. The method of claim 11, wherein, after forming the resist pattern, some resist remains in the second region.

13. The method of claim 12, wherein forming the first and second contact holes comprises etching the resist remaining in the second region and the insulator layer using etch selectivity.

14. The method of claim 10, wherein after patterning the resist, the first contact hole region has a relatively large amount of remaining resist and the first contact hole is formed at a relatively low rate, and the second contact hole region has a relatively small amount or no remaining resist and the second contact hole is formed at a relatively high rate.

15. The method of claim 10, wherein the first and second metal layers have a same height and width.

16. The method of claim 10, wherein the second insulating layer has a greater thickness than that of the first insulating layer.

17. The method of claim 10, wherein the width of the light transmitting portions of the exposure mask are smaller than the width of the conductive layers.

18. The method of claim 10, wherein the planar, horizontal upper surface of the second insulating layer is continuously planar over both the first insulating layer and the second metal layer.

* * * * *